(12) United States Patent
Udayashankar et al.

(10) Patent No.: US 8,610,484 B2
(45) Date of Patent: Dec. 17, 2013

(54) BIPOLAR TRANSISTOR ANTI-SATURATION CLAMP USING AUXILIARY BIPOLAR STAGE, AND METHOD

(75) Inventors: Sudarshan Udayashankar, Tucson, AZ (US); Jerry L. Doorenbos, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 529 days.

(21) Appl. No.: 12/804,752

(22) Filed: Jul. 28, 2010

(65) Prior Publication Data
US 2012/0025891 A1    Feb. 2, 2012

(51) Int. Cl.
*H03K 5/08* (2006.01)
*H03F 3/16* (2006.01)

(52) U.S. Cl.
USPC ........... 327/318; 327/108; 327/109; 327/309; 327/312; 327/313; 327/324; 327/327; 330/300

(58) Field of Classification Search
USPC ......... 327/108, 109, 309, 312, 313, 318, 323, 327/324, 327, 332
See application file for complete search history.

(56) References Cited

U.S. PATENT DOCUMENTS

| | | | | |
|---|---|---|---|---|
| 3,911,293 | A * | 10/1975 | Shafer | 327/51 |
| 5,754,066 | A * | 5/1998 | Smith | 327/108 |
| 6,459,321 | B1 * | 10/2002 | Belch | 327/323 |

OTHER PUBLICATIONS

"Baker Clamp", HTML presentation © Glen Baddeley 2007, 3 pages.

* cited by examiner

*Primary Examiner* — Lincoln Donovan
*Assistant Examiner* — Colleen O Toole
(74) *Attorney, Agent, or Firm* — Alan A. R. Cooper; W. James Brady, III; Frederick J. Telecky, Jr.

(57) ABSTRACT

An output stage (1-2) includes a gain circuit (Q1,Q2) for driving a base of a main transistor (Q3) having a collector coupled to an output (18) in response to an input signal $V_{11}$) which also controls a base of an auxiliary transistor (Q7) having a collector coupled to the output. A clamping transistor (Q6) has a control electrode coupled to the base of the auxiliary transistor, a first electrode coupled to the output, and a second electrode coupled to provide feedback from the output via the gain circuit to the base of the main transistor and to provide feedback from the output to the base of the auxiliary transistor. When the auxiliary transistor goes into deep saturation it causes the clamping transistor to provide negative feedback from the output to the main output stage so as to prevent the main transistor from going into deep saturation.

31 Claims, 4 Drawing Sheets

BIPOLAR TRANSISTOR ANTI-SATURATION CLAMP USING AUXILIARY BIPOLAR STAGE, AND METHOD

BACKGROUND OF THE INVENTION

The present invention relates generally to bipolar transistor output stages, such as comparator output stages and amplifier output stages, and more particularly to circuitry for preventing or reducing problems associated with saturation of transistors in the output stages.

A bipolar transistor has a characteristic reverse recovery time, which is the time required for a transistor in its saturation mode to re-enter its active mode of operation. The recovery time is a process-controlled parameter, and the circuit has to be designed to "work around" the recovery time of the saturated transistor because it slows the circuit response time. (When a bipolar transistor is driven into saturation, charge accumulation occurs in its base region. If the transistor has to quickly switch into its active mode, then a discharge path has to be provided at its base electrodes. Conventional methods used to achieve the discharge path limit the output voltage swing of the collector of the transistor to at least 1 $V_{BE}$ voltage above the negative supply voltage rail. However, in some applications it may be necessary for the collector to be able to swing closer to the negative supply voltage rail.

Figure 1:
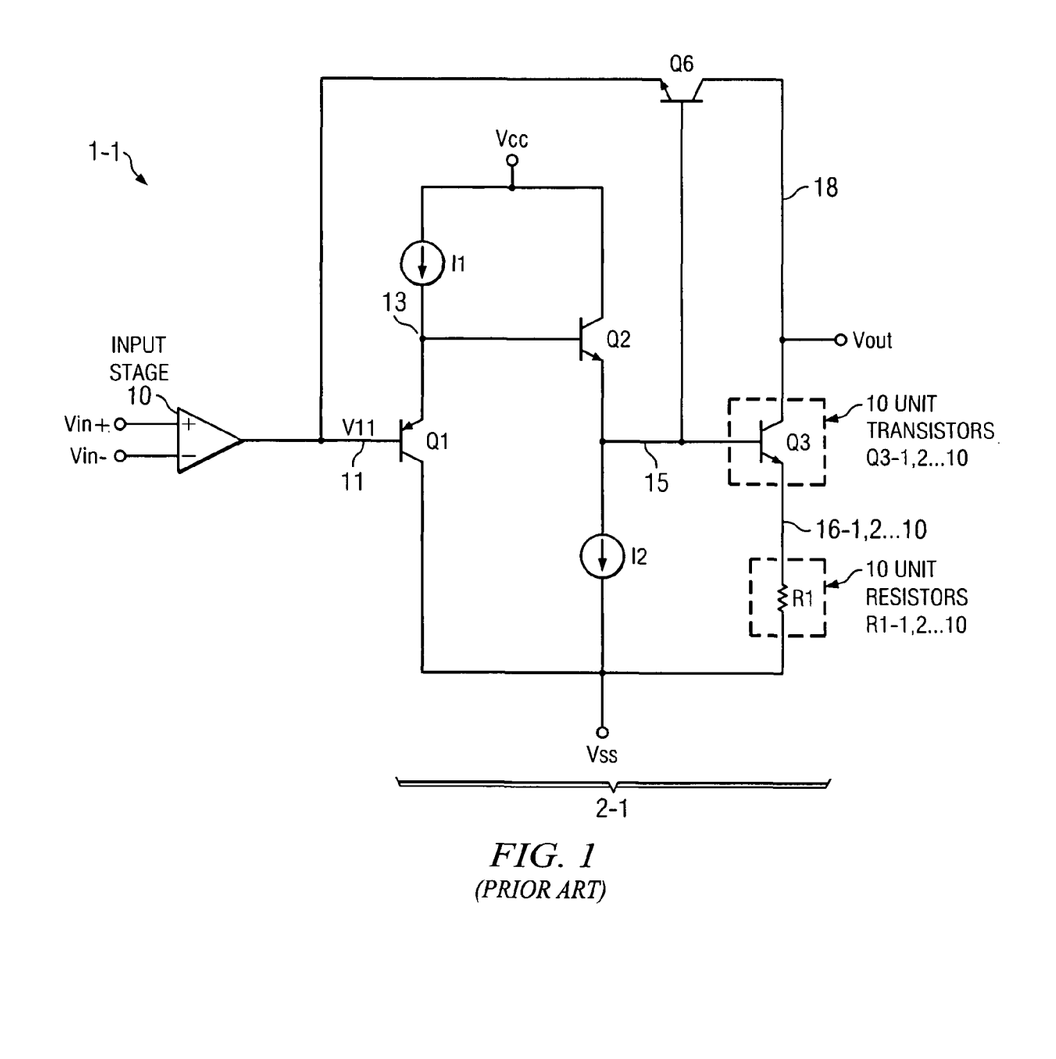
FIG. 1 is a schematic diagram of a prior art comparator output stage.

FIG. 1 shows a known comparator 1-1 including a conventional differential input stage 10 having a (+) input coupled to receive a first input signal and a (−) input coupled to receive a second input $V_{in}^-$. The output of input stage 10 is connected by conductor 11 to the input of an output stage 2-1. Output stage 2-1 includes a PNP input or follower transistor Q1 having its base connected to conductor 11. Output stage 2-1 also includes a clamping transistor Q6 having its emitter connected to conductor 11. The base of transistor Q1 is connected to conductor 11. Output stage 2-1 also includes a NPN follower transistor Q2 and a NPN output transistor Q3. The collector of transistor Q1 is connected to $V_{SS}$, and the emitter of transistor Q1 is connected by conductor 13 to one terminal of a current source I1 and to the base of transistor Q2. The other terminal of current source I1 is connected to $V_{CC}$, and a collector of transistor Q2 is also connected to $V_{CC}$. The emitter of transistor Q2 is connected by conductor 15 to one terminal of a current source I2 and to the base of output transistor Q3, the emitter of which is coupled to $V_{SS}$ by a resistor R1. The other terminal of current source I2 is connected to $V_{SS}$. The collector of output transistor Q3 is connected to comparator output conductor 18, on which a comparator output signal Vout is produced. The base of a clamping transistor Q6 is connected to conductor 15. The collector of clamping transistor Q6 is connected to output conductor 18, and the emitter of clamping transistor Q6 is connected by conductor 11 to the output of differential input circuit 10.

In the present example, output transistor Q3 is composed of 10 identical PNP parallel-connected "unit transistors", each of which has its collector connected to output conductor 18 and its emitter connected to one terminal 16-1, 2 . . . 10 of a separate corresponding "unit" resistor R1-1, 2 . . . 10, respectively. The 10 unit transistors of which output transistor Q3 is composed are collectively referred to as "output transistor Q3" or are individually referred to as "unit transistors Q3-1, 2 . . . 10". The other terminals of each of the 10 unit resistors R1-1, 2 . . . 10 are connected to $V_{SS}$. The 10 unit resistors R1, 2 . . . 10 are collectively referred to as "resistor R1". Output transistor Q3 can also be a single transistor capable of driving large load current.

In operation, input stage 10 of comparator 1-1 generates a voltage $V_{11}$ on conductor 11 and applies it to the base of transistor Q1, causing it to either be in its active mode or its cut off mode of operation. Transistor Q1 drives the base of NPN transistor Q2, the emitter of which drives the base of output transistor Q3 and the base of clamping transistor Q6. Clamping transistor Q6 is turned ON so as to operate in its reverse active mode when the collector of output transistor Q3 goes more negative than its base. (A transistor is in its reverse active mode when its collector is actually functioning as an emitter and its emitter is actually functioning as a collector.) This enables output transistor Q3 to drive comparator output voltage Vout very close to its emitter voltage and hence to the lower supply voltage $V_{SS}$. Note that if the emitter and collector terminals of clamping transistor Q6 are reversed, there could be a relatively large reverse bias across its base-emitter junction. As disclosed in the subsequently mentioned incorporated-by-reference co-pending patent application by the present inventors, that may lead to permanent damage of clamping transistor Q6 due to hot carrier injection. However, the collector-base junction of a bipolar NPN transistor can withstand the large reverse bias without damage.

Although bipolar transistor operation in reverse active mode is very poor for most purposes, it detects when the collector of output transistor Q3 goes more negative than its base and turns clamping transistor Q6ON in its reverse active mode. When that happens, clamping transistor Q6 causes current to flow out of conductor 11, through clamping transistor Q6 in its reverse direction, and into the collector of output transistor Q3. This reduces the base currents of transistors Q1 and Q2 and therefore reduces the base current of output transistor Q3 and therefore limits how much further output transistor Q3 can be driven into saturation. When output transistor Q3 is saturated, all of the unit transistors Q3-1, 2 . . . 10 connected in parallel are individually saturated.

When output transistor Q3 is ON, the collector-base junction of clamping transistor Q6 is forward biased, and provides negative feedback via the base-collector junction of output transistor Q3. The collector of output transistor Q3 is clamped to one forward diode voltage drop below its base and therefore prevents transistor Q3 from going into deep saturation. (A bipolar transistor is in "deep" saturation when its collector-emitter voltage is about 100 millivolts or less and its base-collector junction is forward biased and the reverse recovery time of the transistor becomes unacceptable for a particular circuit.) When output transistor Q3 is turned OFF, the negative feedback from the comparator output voltage Vout is disabled Thus, in order to prevent output transistor Q3 from entering a state of deep saturation (e.g., with $V_{CE}$ (collector-emitter voltage) of less than about 100 millivolts), clamping transistor Q6, when turned ON in its reverse active mode, operates to clamp output voltage Vout to a base-collector junction voltage drop below the voltage on conductor 15, which is approximately equal to one $V_{BE}$ voltage lower than the voltage $V_{11}$ at the output of input stage 10. However, the response time of output voltage Vout of comparator 1-1 is too slow to meet certain desired comparator delay requirements.

One of the disadvantages of output stage 2-1 in Prior Art FIG. 1 is that since output transistor Q3 has an inherent collector resistance, the current through it may already have driven output transistor Q3 into very deep saturation, making it too late for clamping transistor Q6 to be turned ON in its reverse active mode to forward bias its base-collector junction and clamp the base-collector voltage of output transistor Q3 so as to prevent it from being driven into very deep saturation. Furthermore, when output transistor Q3 is in very deep saturation, that results in a very large effective emitter-base capacitance in output transistor Q3. That in turn necessitates a relatively large amount of discharge time for turning output transistor Q3 OFF, and that may unacceptably limit how fast comparator output voltage Vout can be switched.

To avoid the foregoing shortcomings of output stage 2-1 in Prior Art FIG. 1, most comparators use CMOS output stages, which have a faster reverse recovery time; unfortunately, CMOS output stages also have slower overall response during active modes of operation. If a bipolar output transistor is used, its collector voltage is clamped to a level no lower than about 0.7 volt above the lower supply voltage $V_{SS}$ to avoid this problem, but this reduces the output voltage range of the comparator 1-1. CMOS output stages usually are used, because of their zero-DC gate current, in order to achieve a large current gain.

It should be understood that it may be necessary to utilize many emitter follower stages in the output stage of a bipolar transistor amplifier in order to obtain a suitably large current gain. However, this leads to a decrease in the operating signal voltage range with each additional current gain stage. That is especially problematic if the emitter follower stages become saturated and higher base current is required.

To overcome the foregoing problem, various known current boosting techniques have been used, but the known techniques utilize positive feedback, which is problematic in some cases. For example, current gain boosting has been achieved by connecting an additional transistor partly in parallel with the main output transistor (such as Q3 in Prior Art FIG. 1) and connecting the collector of an additional transistor to the input of a current mirror input to provide positive feedback in the output stage under consideration. Under certain circumstances, the amount of positive feedback may be far too great, causing unacceptable circuit instability, excessive power consumption, and/or lock-up behavior.

A conventional output circuit stage known as the Baker clamp provides positive feedback and is used in some power amplifiers. Details of the Baker clamp circuit presently are available at the website http://home.mira.net/~gnb/audio/bakerclamp.html.

Thus, there is an unmet need for an output stage, such as a comparator output stage or an amplifier output stage, which substantially avoids problems associated with saturation of bipolar output transistors therein.

There also is an unmet need for a comparator (or amplifier) bipolar transistor output stage that prevents the comparator output voltage (or amplifier output voltage) from going into extreme saturation but nevertheless allows it to swing very close to the lower supply voltage $V_{SS}$.

There also is an unmet need for a circuit that keeps an output transistor of a comparator from going into extreme saturation and nevertheless allows the output voltage of the comparator to swing very close to the lower supply voltage of the comparator.

There also is an unmet need for an amplifier having a bipolar transistor output stage capable of delivering a large output load current without having to use too many emitter follower stages to obtain the required current gain, and without substantially reducing the operating voltage range of the circuit of the output stage.

SUMMARY OF THE INVENTION

It is a an object of the invention to provide an output stage, such as a comparator output stage or an amplifier output stage, which substantially avoids problems associated with saturation of bipolar output transistors therein.

It is another object of the invention to provide a comparator (or amplifier) bipolar transistor output stage that prevents the comparator output voltage (or amplifier output voltage) from going into extreme saturation but nevertheless allows it to swing very close to the lower supply voltage $V_{SS}$.

It is another object of the invention to provide a circuit that keeps an output transistor of a comparator from going into extreme saturation and nevertheless allows the output voltage of the comparator to swing very close to the lower supply voltage of the comparator.

It is another object of the invention to provide an amplifier having a bipolar transistor output stage capable of delivering a large output load current without having to use too many emitter follower stages to obtain the required current gain, and without substantially reducing the operating voltage range of the circuit of the output stage.

Briefly described, and in accordance with one embodiment, the present invention provides an output stage (1-2) that all includes a gain circuit (Q1,Q2) for driving a base of a main transistor (Q3) having a collector coupled to an output (18) in response to an input signal ($V_{11}$) which also controls a base of an auxiliary transistor (Q7) having a collector coupled to the output. A clamping transistor (Q6) has a control electrode coupled to the base of the auxiliary transistor, a first electrode coupled to the output, and a second electrode coupled to provide feedback from the output via the gain circuit to the base of the main transistor and to provide feedback from the output to the base of the auxiliary transistor. When the auxiliary transistor goes into deep saturation it causes the clamping transistor to provide negative feedback from the output to the main output stage so as to prevent the main transistor from going into deep saturation.

In one embodiment, the invention provides a circuit (1-2) including a main output stage (2-2) with a main output transistor (Q3) having a base coupled to operate in response to a first input signal ($V_{11}$), an emitter coupled to a first reference voltage ($V_{SS}$), and a collector coupled to an output conductor (18). An auxiliary output stage (3) includes an auxiliary output transistor (Q7) having a base coupled to operate in response to the first input signal ($V_{11}$), an emitter coupled to the first reference voltage ($V_{SS}$), and a collector coupled to the output conductor (18). A clamping transistor (Q6) has a control electrode coupled to the base of the auxiliary output transistor (Q7), a first electrode coupled to provide feedback via a first gain circuit (Q1,Q2) to the base of the main output transistor (Q3) and to also provide feedback to the base of the auxiliary output transistor (Q7), and a second electrode coupled to the collector of the auxiliary output transistor (Q7). The auxiliary output stage (3) supplies an amount of drive to the base of the auxiliary output transistor (Q7) corresponding to an amount of drive supplied by the main output stage (2-2) to the base of the main output transistor (Q3) such that the auxiliary output transistor (Q7) goes into deep saturation and causes the clamping transistor (Q6) to generate negative feedback that limits drive to the base of the main output transistor (Q3) so as to prevent the main output transistor (Q3) from going into deep saturation.

In one embodiment, an emitter area of the auxiliary output transistor (Q7) is substantially smaller than an emitter area of the main output transistor (Q3), wherein the emitter of the main output transistor (Q3) is coupled by a first resistor (R1) to the first reference voltage ($V_{SS}$), and wherein the emitter of the auxiliary output transistor (Q7) is coupled by a second resistor (R2) to the first reference voltage ($V_{SS}$), and wherein the first electrode of the clamping transistor (Q6) is also coupled to provide the feedback via a second gain circuit (Q4,Q5) to the base of the auxiliary output transistor (Q7).

In one embodiment, the auxiliary output stage (3) supplies an amount of drive to the base of the auxiliary output transistor (Q7) that is approximately equal to the amount of drive supplied by the main output stage (2-2) to the base of the main output transistor (Q3).

In one embodiment, the first gain circuit (Q1,Q2) includes a first transistor (Q1) having a control electrode coupled to receive the first input signal ($V_{11}$), a first electrode coupled to a control electrode of a second transistor (Q2), and a second electrode coupled to a first reference voltage ($V_{SS}$), and wherein the main output transistor (Q3) has a base coupled to a first electrode of the second transistor (Q2). The second gain circuit (Q4,Q5) includes a third transistor (Q4) having a control electrode coupled to receive the first input signal ($V_{11}$), a first electrode coupled to a control electrode of a fourth transistor (Q5), and a second electrode coupled to the first reference voltage ($V_{SS}$), and wherein the auxiliary output transistor (Q7) has a base coupled to a first electrode of the fourth transistor (Q5) and an emitter coupled by a second resistor (R2) to the first reference voltage ($V_{SS}$).

In a described embodiment, the first transistor (Q1) is a PNP transistor and the second transistor (Q2) is an NPN transistor, an emitter of the first transistor (Q1) being coupled to a first current source (I1) and a base of the second transistor (Q2), an emitter of the second transistor (Q2) being coupled to a second current source (I2) and the base of the main output transistor (Q3). The third transistor (Q4) is a PNP transistor and the fourth transistor (Q5) is an NPN transistor, an emitter of the third transistor (Q4) being coupled to a third current source (I3) and a base of the fourth transistor (Q5). An emitter of the fourth transistor (Q5) is coupled to a fourth current source (I4) and the base of the auxiliary output transistor (Q7). In a described embodiment, the clamping transistor (Q6) is an NPN transistor having an emitter coupled to the bases of the first (Q1) and third (Q4) transistors, a base coupled to the base of the auxiliary output transistor (Q7), and a collector coupled to the collector of the auxiliary output transistor (Q7).

In one embodiment, and input circuit (10) produces the first input signal ($V_{11}$) in response to a second input signal ($V_{in}^+$) and a third input signal ($V_{in}^-$), wherein the circuit (1-2) is a comparator.

In one embodiment, the circuit (1-3) includes a current boost circuit (17) and an additional output transistor (Q8) having a base coupled to the base of the auxiliary output transistor (Q7), an emitter coupled to the first reference voltage ($V_{SS}$), and a collector coupled to an input of the current boost circuit (17). An output of the current boost circuit (17) is coupled to the base of the main output transistor (Q3). In a described embodiment, the current boost circuit (17) includes a diode-connected current mirror input transistor (Q9) coupled to the collector of the additional output transistor (Q8) and a current mirror output transistor (Q10) coupled to the base of the main output transistor (Q3).

In one embodiment, the additional output transistor (Q8) has a base coupled to the base of the auxiliary output transistor (Q7), an emitter coupled by a third resistor (R3) to the first reference voltage ($V_{SS}$), and a collector coupled to an input of the current boost circuit (17). An output of the current boost circuit (17) is coupled to the base of the main output transistor (Q3). The current boost circuit (17) includes a diode-connected current mirror input transistor (Q9) coupled to the collector of the additional output transistor (Q8) and a current mirror output transistor (Q10) coupled to the base of the main output transistor (Q3). The current mirror output transistor (Q10) is scaled relative to the current mirror input transistor (Q9) so as to provide adequate boost current into the base of the main output transistor (Q3) for a predetermined amount of current produced by the third current source (I3).

In a described embodiment, the main output transistor (Q3) is composed of a plurality of parallel-connected unit transistors (Q3-1, 2 . . . ) and the auxiliary output transistor (Q7) has the same emitter area as a single unit transistor. The first resistor (R1) is composed of a plurality of unit resistors (R1-1, 2 . . . ) each having a first terminal coupled to an emitter of a corresponding one of the unit transistors (Q3-1, 2 . . . ) and a second terminal coupled to the first reference voltage ($V_{SS}$).

In a described embodiment, the emitter area of the auxiliary output transistor (Q7) is sufficiently smaller than the emitter area of the main output transistor (Q3) to cause auxiliary output transistor (Q7) to go into deep saturation in response to the first ($V_{in}^+$) and second ($V_{in}^-$) input signals before the main output transistor (Q3) can go into deep saturation.

In one embodiment, the invention provides a method for preventing deep saturation of an output transistor (Q3) in an output stage (4-1) that is driving an output voltage (Vout) to a level very close to its emitter voltage, the method including applying a first voltage level of a drive signal ($V_{11}$) to an input of a main output stage (2-2) including gain circuitry (Q1,Q2) for driving a base of a main output transistor (Q3) having an emitter coupled to the first reference voltage ($V_{SS}$) and a collector coupled to an output conductor (18) conducting the output voltage (Vout); also applying the first voltage level of the drive signal ($V_{11}$) to an input of an auxiliary output stage (2-2) a for driving a base of an auxiliary output transistor (Q7) having an emitter coupled to the first reference voltage ($V_{SS}$) and a collector coupled to the output conductor (18); and turning on a clamping transistor (Q6) when the auxiliary output transistor (Q7) goes into a deep saturation condition to cause the clamping transistor (Q6) to provide negative feedback from the collector of the auxiliary output transistor (Q7) to the main output stage (2-2) to prevent the main output transistor (Q3) from going into a deep saturation condition.

In one embodiment, the method includes operating the auxiliary output stage (3) to supply an amount of drive to the base of the auxiliary output transistor (Q7) that is approximately equal to an amount of drive supplied by the main output stage (2-2) to the base of the main output transistor (Q3). In one embodiment, the method also includes operating an additional output transistor (Q8) having a base coupled to the base of the auxiliary output transistor (Q7) and a collector coupled to an input of a current mirror (17) to cause the current mirror (17) to supply a boost current to the base of the main output transistor (Q3). In one embodiment, the method includes coupling a constant current source (I3) to supply a limited amount of base current (I3) to the auxiliary output transistor (Q7) to effectively limit the amount of the boost current and thereby limit positive feedback between the base of auxiliary output transistor (Q7) and the base of the main output transistor (Q3).

In one embodiment, the method includes providing the auxiliary output transistor (Q7) with an emitter area that is sufficiently smaller than the emitter area of the main output transistor (Q3) to cause the auxiliary output transistor (Q7) to go into deep saturation in response to the first ($V_{in}^+$) and second ($V_{in}^-$) input signals before the main output transistor (Q3) can go into deep saturation.

In one embodiment, the method includes operating an additional output transistor (Q8) having a base coupled to base of the auxiliary output transistor (Q7) to produce a feedback current (24) representative of current in the collector of the auxiliary output transistor (Q7), and mirroring the feedback current into the base of the main output transistor (Q3) by means of a current mirror (17).

In one embodiment, the method includes a circuit for preventing deep saturation of an output transistor (Q3) in an output stage (4-1) that is driving an output voltage (Vout) to a level very close to its emitter voltage, including means (10, 11) for applying a first voltage level of a drive signal ($V_{11}$) to an input of a main output stage (2-2) including circuitry for driving a base of a main output transistor (Q3) having an emitter coupled by a first resistor (R1) to the first reference voltage ($V_{SS}$) and a collector coupled to an output conductor (18) conducting the output voltage (Vout); means (10,11) for also applying the first voltage level of the drive signal ($V_{11}$) to an input of an auxiliary output stage (2-2) including circuitry for driving a base of an auxiliary output transistor (Q7) having an emitter coupled by a second resistor (R2) to the first reference voltage ($V_{SS}$) and a collector coupled to the output conductor (18); and means (Q5,21,Q7,18) for turning on a clamping transistor (Q6) when the auxiliary output transistor (Q7) goes into a deep saturation condition to cause the clamping transistor (Q6) to provide negative feedback from the collector of the auxiliary output transistor (Q7) to the input of the main output stage (2-2) to prevent the main output transistor (Q3) from going into a deep saturation condition.

In one embodiment, the circuit (1-4) includes an output stage (2-2) including gain circuitry (Q1,Q2) having an input (11) coupled to receive an input signal ($V_{11}$), a main output transistor (Q3) having a base coupled to an output (15) of the gain circuitry (Q1,Q2), an emitter coupled by a first resistor (R1) to a first reference voltage ($V_{SS}$), and a collector coupled to an output conductor (18); a clamping transistor (Q6) having a control electrode coupled to the base of the auxiliary output transistor (Q7), a first electrode coupled to the input (11) of the gain circuitry (Q1,Q2), and a second electrode coupled to the collector of the auxiliary output transistor (Q7); and boost circuitry including an additional output transistor (Q8) having a base coupled to the base of the auxiliary output transistor (Q7), an emitter coupled by a second resistor (R3) to the first reference voltage ($V_{SS}$) to produce a collector current (24) representative of current in the collector of the auxiliary output transistor (Q7), and a current mirror (17) for mirroring the collector current of the auxiliary output transistor (Q7) via the gain circuitry (Q1, Q2) into the base of the main output transistor (Q3). The current mirror (17) includes a diode-connected current mirror input transistor (Q9) coupled to the collector of the additional output transistor (Q8) and a current mirror output transistor (Q10) coupled to the base of the main output transistor (Q3), a first degeneration resistor (R4) coupled between a second reference voltage ($V_{CC}$) and an electrode of the current mirror input transistor (Q9), and a second degeneration resistor (R5) coupled between the second reference voltage ($V_{CC}$) and an electrode of the current mirror output transistor (Q10).

DETAILED DESCRIPTION OF THE PREFERRED EMBODIMENTS

Figure 2:
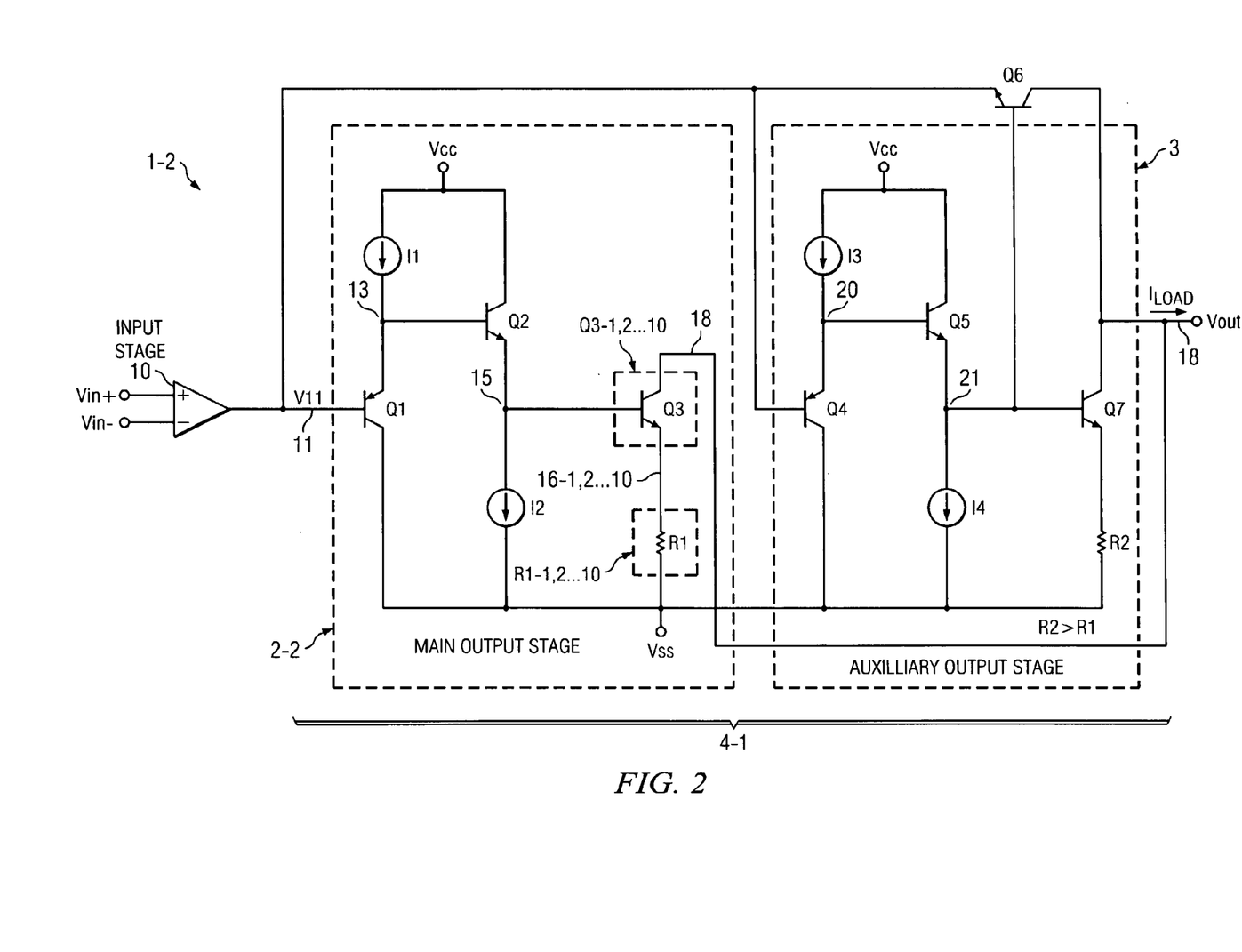
FIG. 2 is a schematic diagram of one embodiment of the present invention.

FIG. 2 shows a basic implementation of the output stage of the present invention in which an auxiliary output circuit is provided in conjunction with the output stage shown in Prior Art FIG. 1 to improve switching speed. Referring to FIG. 2, a comparator 1-2 includes a differential input stage 10 including a (+) input coupled to receive a first input signal $V_{in}^+$ and a (−) input coupled to receive a second input signal $V_{in}^-$. Input stage 10 applies a drive signal $V_{11}$ on conductor 11, which is connected to the input of an output stage 4-1.

Input stage 10 may be implemented by means of a comparator input stage disclosed in the assignee's co-pending patent application by the present inventors, entitled "Circuitry and Method for Preventing Base-Emitter Junction Reverse Bias in Comparator Differential Input Transistor Pair", Ser. No. 12/804,658, filed on Jul. 27, 2010, and incorporated herein by reference.

Output stage 4-1 includes a main output stage 2-2, an auxiliary output stage 3, and a NPN clamping transistor Q6. (Main output stage 2-2 is essentially the same as output stage 2-1 of Prior Art FIG. 1, except that clamping transistor Q6 in FIG. 2 is shown outside of main output stage 2-2.) Main output stage 2-2 in FIG. 2 includes PNP input or follower transistor Q1 having its base connected to conductor 1. Clamping transistor Q6 has its emitter connected by conductor 11 to the output of input stage 10. Main output stage 2-2 also includes a NPN follower transistor Q2 and a main NPN output transistor Q3. The collector of transistor Q1 is connected to $V_{SS}$. The emitter of transistor Q1 is connected by conductor 13 to one terminal of current source I1 and to the base of transistor Q2. The other terminal of current source I1 is connected to $V_{CC}$. The collector of transistor Q2 also is connected to $V_{CC}$. The emitter of transistor Q2 is connected by conductor 15 to one terminal of current source I2 and to the base of main output transistor Q3, which has its emitter coupled to $V_{SS}$ by means of a resistor R1. The other terminal of current source I2 is connected to $V_{SS}$. The collector of main output transistor Q3 is connected to output conductor 18, on which the comparator output signal Vout is produced.

In this example, the emitter of transistor Q2 is actually connected by conductor 15 to the bases of 10 parallel-connected unit transistors Q3-1, 2 . . . 10 which are collectively referred to as "main output transistor Q3". The emitters of unit transistors Q3-1, 2 . . . 10 are connected by corresponding conductors 16-1, 2 . . . 10 to 10 parallel-connected unit resistors R1-1, 2 . . . 10, respectively, which are collectively referred to as "resistor R1".

Auxiliary output stage 3 is a close replica of main output stage 2-2, and includes PNP follower transistor Q4 having its base connected to the output signal $V_{11}$ of input stage 10. Auxiliary output stage 3 also includes NPN follower transistor Q5 and NPN auxiliary output transistor Q7. However, auxiliary output transistor Q7 preferably is a single unit transistor of the same kind as those of which main output transistor Q3 is composed. The collector of transistor Q4 is connected to $V_{SS}$. The emitter of transistor Q4 is connected by conductor 20 to one terminal of current source I3 and to the base of NPN follower transistor Q5. The other terminal of current source I3 is connected to $V_{CC}$. The collector of transistor Q5 is also connected to $V_{CC}$. The emitter of transistor Q5 is connected by conductor 21 to one terminal of current source I4 and to the base of auxiliary output transistor Q7, which has its emitter coupled to $V_{SS}$ by a resistor R2. The other terminal of current source I4 is connected to $V_{SS}$. Resistor R2 can be composed of a single unit resistor of the same kind as those of which resistor R1 is composed. (In some cases, resistors R1 and R2 may be replaced by short circuits to $V_{SS}$.)

Figure 3:
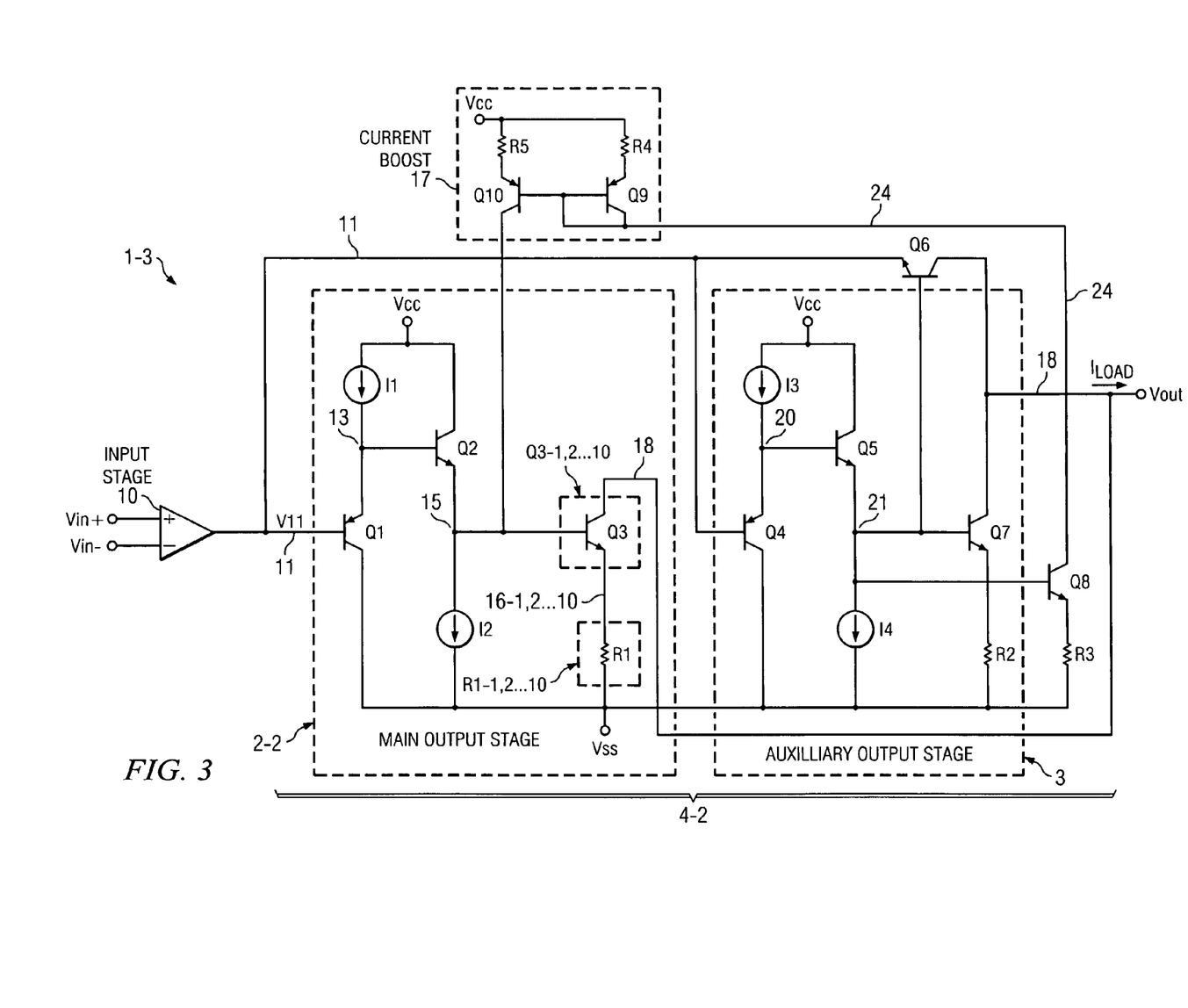
FIG. 3 is a schematic diagram of another embodiment of the present invention.

Conductor 21 in auxiliary output stage 3 is also connected to the base of above mentioned clamping transistor Q6. The collector of auxiliary output transistor Q7 is connected to Vout conductor 18. The collector of clamping transistor Q6 is also connected to output conductor 18, and the emitter of clamping transistor Q6 is connected by conductor 11 to the output of input stage 10 and the input of main output stage 2-2. The emitter area of auxiliary output transistor Q7 in FIGS. 2 and 3 is much smaller (e.g., 10 times smaller) than the emitter area of main output transistor Q1. Suitable circuitry (not shown) may be included to provide a desired voltage gain between input stage 10 and transistor Q1.

FIG. 3 shows another comparator 1-3 which provides additional circuitry to improve the performance of comparator 1-2 of FIG. 2. Referring to FIG. 3, output stage 4-2 includes main output stage 2-2 and auxiliary output stage 3, as in FIG. 2. Output stage 4-2 of FIG. 3 also includes a current boost circuit 17, an additional NPN output transistor Q8 driven by auxiliary output stage 3, and a resistor R3 coupled between the emitter of additional output transistor Q8 and $V_{SS}$.

Current boost circuit 17 in FIG. 3 is a current mirror that includes a diode-connected PNP input transistor Q9 and a PNP output transistor Q10. The base and collector of current mirror input transistor Q9 and the base of current mirror output transistor Q10 are connected by conductor 24 to the collector of transistor Q8, the collector of which is connected by conductor 21 to the emitter of transistor Q5 in FIG. 3. The base of current mirror output transistor Q10 is connected by conductor 15 to the base of main output transistor Q3. The emitters of current mirror transistors Q9 and Q10 are coupled to $V_{CC}$ by degeneration resistors R4 and R5, respectively.

In the operation of the output stages 4-1 and 4-2 of FIGS. 2 and 3, respectively, the smaller auxiliary output transistor Q7, which receives essentially the same drive voltage on conductor 21 as the large main output transistor Q3, goes into deep saturation earlier than main output transistor Q3 due to higher current density in the collector of transistor Q7. (The sizes (i.e., the emitter areas) of transistors Q7 and Q3 may be selected to determine how much earlier transistor Q7 saturates than output transistor Q3 would otherwise saturate. The smaller transistor Q7 is relative to transistor Q3, the earlier transistor Q7 saturates. In effect, anti-saturation clamping transistor Q6 turns on in its reverse active mode of operation when main output transistor Q3 is just beginning to become saturated. For example, auxiliary output transistor Q7 may be in deep saturation when its collector-emitter voltage has fallen to approximately 50 millivolts, whereas at the same time main output transistor Q3 may be only on the edge of saturation with its collector-emitter voltage reduced to only approximately 150 millivolts. (Although in a high voltage application it is necessary that clamping transistor Q6 operate in its reverse active mode, in a sufficiently low voltage application it could actually have its "real" emitter connected to the collector of the auxiliary output transistor Q7 and its "real" collector connected to conductor 11.)

The above mentioned problems of the output stage in Prior Art FIG. 1 include the fact that (1) it too slow to meet certain desired comparator delay requirements, (2) output transistor Q3 may have been driven into very deep saturation too late for clamping transistor Q6 to be turned ON in its reverse active mode so as to prevent output transistor Q3 from being driven into the very deep saturation condition in the first place, and (3) output transistor Q3 has a very large emitter-base capacitance which unacceptably limits how fast the comparator output voltage Vout can be switched.

The foregoing problems of the output stage 2-1 in Prior Art FIG. 1 are solved by the use of auxiliary output stage 3 in FIG. 2 to control the operation of clamping transistor Q6 so as to prevent the collector-emitter voltage of main output transistor Q3 from reaching a deep saturation level. Auxiliary output stage 3 may be a close replica of the output stage 2-2, but with a much smaller auxiliary output transistor Q7. When auxiliary output transistor Q7 starts to conduct a predetermined amount of current, it goes into deep saturation much sooner than main output transistor Q3, which may be conducting the same amount of current because main output stage 2-2 and auxiliary output stage 3 may be essentially the same except for the substantially different sizes of output transistors Q3 and Q7.

More specifically, if the output voltage $V_{11}$ of input stage 10 falls to a sufficiently low level to cause auxiliary output stage 3 to pull Vout close enough to $V_{SS}$ to bring auxiliary output transistor Q7 into a saturated condition (in which its base-collector junction becomes forward biased), this forward biases the base-collector junction of clamping transistor Q6, forcing it into its reverse active mode of operation. Clamping transistor Q6 then draws current out of conductor 11, thereby providing negative feedback which limits the amount of base drive current available to transistors Q1 and Q4. This in turn limits the amount of base current available to drive transistor Q2, which responds by limiting the amount of base current available to drive main output transistor Q3, and thereby prevents main output transistor Q3 from going deeper into saturation, even though the much smaller auxiliary output transistor Q7 has already been driven much deeper into saturation, and consequently has pulled Vout very close to $V_{SS}$ (e.g., to within about 50 millivolts) of the emitter voltage of transistor Q7.

When main output transistor Q3 is turned OFF (output voltage Vout high), the above mentioned negative feedback is disabled.

At any particular time, the collector voltage of main output transistor Q3 is not more than a forward-biased collector-base junction voltage drop below the base voltage of auxiliary output transistor Q7. The negative feedback around the base-collector junction of transistor Q7 ensures that its collector-emitter voltage does not drop below about 50 millivolts. However, since auxiliary output transistor Q7 does go into deep saturation, it pulls comparator output voltage Vout to within approximately 50 millivolts of its emitter voltage, even though the collector-emitter voltage of main output transistor Q3 is still about 150 millivolts and not in deep saturation.

By choosing the sizes of transistors Q3 and Q7, the speed of operation can be increased to the extent practical for the integrated circuit manufacturing process being used. The smaller the size of auxiliary output transistor Q7, the faster or earlier it saturates, compared to main output transistor Q3, in response to the input signal $V_{11}$. Auxiliary output transistor Q7 is substantially smaller than main output transistor Q3, but resistor R2 is ordinarily higher in value than resistor R1. For example, if one milliampere flows through both resistors R1 and R2, and if resistance R2 is substantially greater than resistance R1, then the IR voltage drop across resistor R2 is greater than across resistor R1. That leaves much less "voltage room" for the emitter and collector voltages of auxiliary output transistor Q7, and therefore it saturates faster or earlier than main output transistor Q3.

The fact that the collectors of transistors Q3 and Q7 both are connected to Vout conductor 18 makes it possible for the collector-emitter voltage of transistor Q3 to be greater than a deep saturation level (for example, the collector-emitter voltage of main output transistor Q3 may be about 150 millivolts) while the collector-emitter voltage of transistor Q7 is at a deep saturation level of 50 millivolts. This is because while the collector voltages of transistors Q3 and Q7 are identical, their emitter voltages of transistors are different by virtue of the different values of resistors R2 and R1 and the different currents flowing through them. Therefore, the circuit of FIG. 2 can be designed to provide a desired relatively large $V_{CE}$ of transistor Q3 even though the $V_{CE}$ of transistor Q7 is in deep saturation, with a $V_{CE}$ value of about 50 millivolts.

This operation, wherein auxiliary output transistor Q7 goes into deep saturation in order to pull Vout very close to $V_{SS}$ while also preventing main output transistor Q3 from going into deep saturation, can be accomplished by suitably scaling the values of resistors R1 and R2.

Consequently, it is necessary to discharge only the resulting relatively low base-emitter saturation capacitance of auxiliary output transistor Q7 instead of having to discharge the much higher base-emitter saturation capacitance that main output transistor Q3 would have if it were allowed to be driven into deep saturation.

The maximum required amount of load current $I_{LOAD}$ to be produced by output stage 4-1 (e.g., 20 milliamperes maximum) determines two aspects thereof. First, it determines the number of emitter-follower stages such as Q1 and Q2 required to produce 20 milliamperes from Vout conductor 20. Second, it determines the sizing of main output transistor Q3 to enable it to provide a value of $I_{LOAD}$ equal to 20 milliamperes.

Based on straight-forward calculations, assuming the current gain β of main output transistor Q3 is equal to 100, at least three current gain stages would be required in output stage 4-1 to achieve a desired gain of 1 approximately million. However, since Q3 is in slight saturation, an additional current gain stage is required to achieve the desired overall gain of approximately 1 million. The size of main output transistor Q3 is selected so it can drive a predetermined load. To reduce the base-emitter capacitance of main output transistor, main output transistor Q3 is composed of 10 parallel-connected unit transistors, each having a relatively small emitter area (e.g., 2 square microns).

The base-emitter capacitance of main output transistor Q3 can have two components, including (1) the capacitance due to the emitter area of transistor Q3, and (2) the capacitance due to saturation of transistor Q3. In the present example, the large main output transistor Q3 was split into 10 parallel transistors to avoid the effects of excessive capacitance due to area of the transistor. A resistance equal to R1 is coupled in series with the capacitance of each such parallel transistor. An important benefit of splitting transistor Q3 into 10 parts is that the current through each of them is divided by 10, and this reduces the voltage drop across each resistance R1 by a factor of 10. This avoids excessive voltage drop across each resistance R1 and allows the output voltage Vout to be driven closer to $V_{SS}$. However, when transistor Q3 is in deep saturation, the capacitance component due to its saturation dominates the capacitance component due to total emitter area. Note that splitting transistor Q3 into 10 parts does not actually help in reducing the increase in base-emitter capacitance when transistor Q3 is in saturation, but it allows Vout to be driven closer to $V_{SS}$.

In this example, auxiliary output stage 3 in FIG. 2 is a close replica of main output stage 2-2, except that auxiliary output transistor Q7 is composed of only a single unit transistor instead of the 10 unit transistors Q3-1, 2 . . . 10 in main output stage 2-2. Since auxiliary output transistor Q7 has essentially the same preceding emitter-follower circuitry as main output transistor Q3, auxiliary output transistor Q7 receives 10 times more base current than each of the 10 identical output unit transistors Q3-1, 2 . . . 10. Consequently, auxiliary output transistor Q7 goes into deep saturation before main output transistor Q3. Therefore, when comparator output voltage Vout undergoes a transition from a high voltage level to a low voltage level, auxiliary output transistor Q7 goes more deeply into saturation than the 10 unit transistors Q3-1, 2 . . . 10 of which main output transistor Q3 is composed. As previously mentioned, this forward biases the base-collector junction of clamping transistor Q6 and turns it ON in its reverse active mode and reduces the amount of drive voltage and current to the base of transistor Q1. That in turn prevents main output transistor Q3 from going into deep saturation, thereby in effect clamping the collector of main output transistor Q3 at the edge of saturation. Computer simulations of the operation of the circuit in FIG. 2 indicate that the delay time of comparator 1-2 of FIG. 2 is reduced by a factor of approximately 2 compared to the delay time of comparator 1-1 of Prior Art FIG. 1.

In the output stage 4-1 of FIG. 2, the maximum output current drive of main output transistor Q3 can be calculated according to the expression $$I_{LOAD}=\beta out*I(\text{out-1})=\beta out*[\beta(\text{out-1})*I(\text{out-2})],$$

where $I_{LOAD}$ is the current flowing out of conductor 18 to a load circuit, βout is the current gain of transistor Q3, β(out-1) is the current gain of transistor Q2, I(out-1) is the collector current of transistor Q2, and I(out-2) is the collector current of transistor Q1.

When Vout is at a low voltage, e.g., within approximately 100 millivolts of $V_{SS}$, unit transistors Q3-1, 2 . . . 10 are saturated enough that the current gain β of main output transistor Q3 is reduced by a factor of approximately 10. Consequently, if an additional current gain stage is not used, then the maximum load current $I_{LOAD}$ that main output transistor Q3 can supply through output conductor 18 to a load (not shown) is reduced by a factor of 10, as evident from the foregoing equation above indicating the current gain of the output stage.

To overcome this limitation, current boost stage 17 as shown in FIG. 3 boosts the base current of main output transistor Q3 when auxiliary output stage 3 comparator drives Vout to a low voltage by mirroring the current through additional output transistor Q8 into the base of main output transistor Q3. FIG. 3 shows an embodiment of the invention wherein the output stage circuitry 4-1 of FIG. 2 is combined with current boost stage 17. The boosting is accomplished by turning on additional output transistor Q8, which has its base connected by conductor 21 to the base of auxiliary output transistor Q7. The collector current of transistor Q8 is drawn through diode-connected current mirror input transistor Q9 and mirrored through current mirror output transistor Q10 into the base of main output transistor Q3.

Additional output transistor Q8 in effect mirrors a portion of the collector current of auxiliary output transistor Q7 back into the base of main output transistor Q3. The configuration of output stage 4-2 in FIG. 3 can provide sufficient drive current into the base of main output transistor Q3 without the need provide a positive feedback loop in output stage 4-2, and therefore avoids instability in output stage 4-2.

The configuration of output stage 4-2 in FIG. 3 also allows a desired maximum value of $I_{LOAD}$ to be provided without use of multiple emitter follower stages in output stage 4-2. Boost circuit 17 also makes it practical to provide a lower value of current supplied by current source I1. This lowers the total amount of power supply current required by comparator 1-3 of FIG. 3.

Thus, current mirror circuit 17 is used between the auxiliary output and the output stage, with the output transistor of the auxiliary stage supplying the input current to a current mirror. When auxiliary output transistor Q7 is turned on, current mirror 17 starts to pump current into the base of the output transistor Q3. This reduces the current gain requirement from the previous stages significantly, thus eliminating the need for the previously mentioned prior art technique of using multiple emitter followers in the output stage.

It should be noted that there is no positive feedback through the current boost circuit 17 in FIG. 3. The following example shows why positive feedback does not occur in the feedback loop through current boost circuit 17 and transistor Q8. Main output transistor Q3 drives a large load, e.g., one that has a load demand of 10 milliamperes. During that demand, main output transistor Q3 requires a large amount of base current, most of which must be applied by current mirror output transistor Q10, rather than follower transistor Q2. The large amount of current supplied by current mirror output transistor Q10 is mirrored from the current in current mirror input transistor Q9, which is supplied by transistor Q8. Consequently, transistor Q8 also requires relatively large amount of base current, which is supplied from the emitter of transistor Q5. The base current of transistor Q5 is supplied from fixed current source I3. (Note that the term "I3" is used herein to refer to either the current I3 or the current source that supplies that current.)

The value of current I3 should be set to a relatively small value which is just large enough to supply the base current required by transistor so it can supply just enough base current to Q8 to cause it to draw enough current from current mirror input transistor Q9 to provide the mirrored current supplied to the base of main output transistor Q3 by current mirror output transistor Q10. Consequently, the boost current supplied to the base of main output transistor Q3 is limited by the fixed value of current source I3 and therefore prevents the feedback through current mirror 17 from becoming positive. The objectives of delivering a large output load current without using too many emitter follower stages to obtain the required current gain, without substantially reducing the operating voltage range of the output stage, and without substantially increasing the quiescent current of the amplifier 1-3 can be accomplished by providing a relatively small value of current I3 and by selecting the ratio between current mirror transistors Q9 and Q10 so as to apply the needed amount of base current is to main output transistor Q3 without increasing the current I3.

Figure 4:
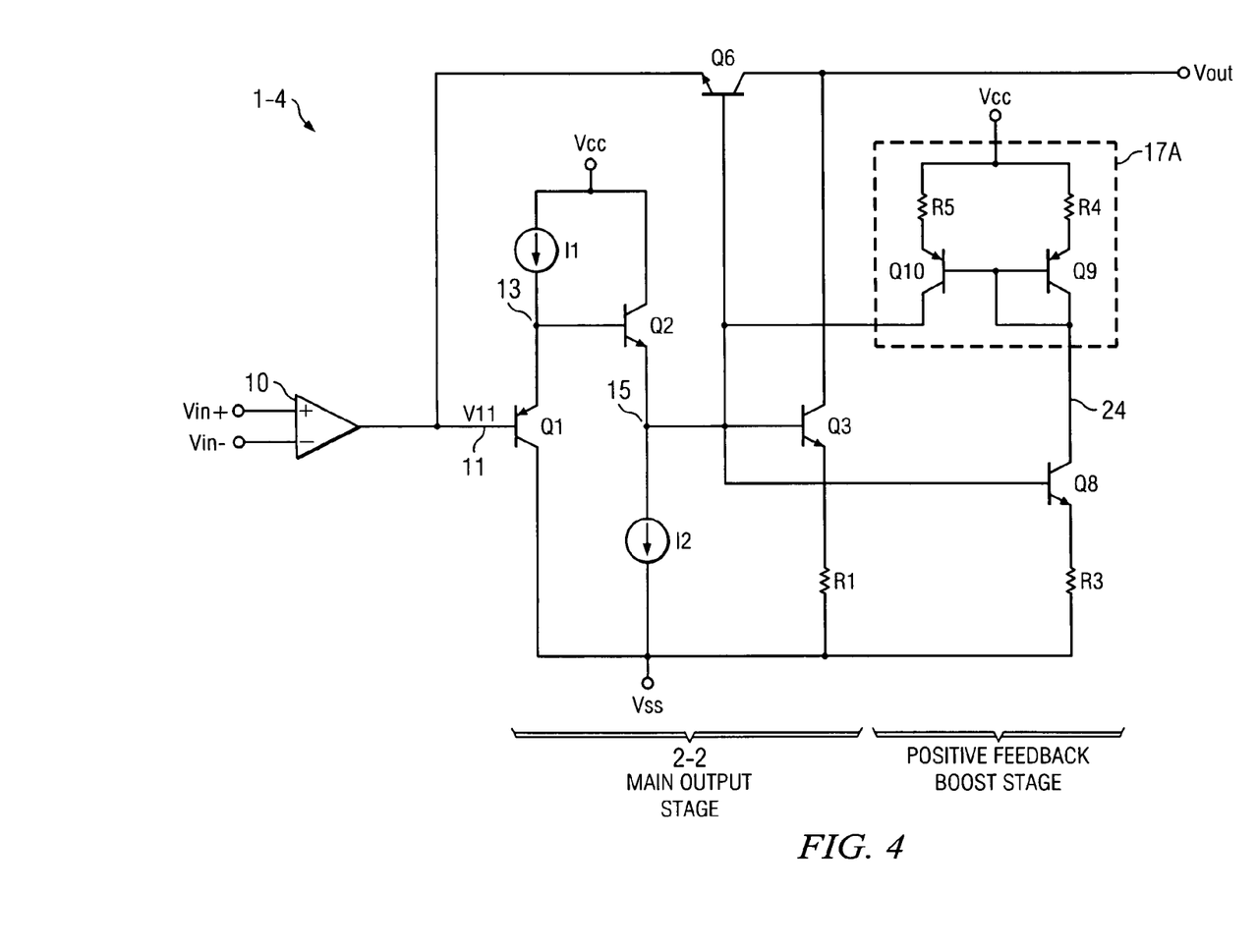
FIG. 4 is a schematic diagram of another embodiment of the present invention.

FIG. 4 shows an output stage 1-4 which combines output circuit 1-4 of Prior Art FIG. 1 with positive feedback boost circuitry as shown in FIG. 3, including current mirror 17A, transistor Q8, and resistor R3. However, the base of transistor Q8 is connected to the base of main output transistor Q3 by means of conductor 15, and the output of current mirror 17A is also connected to the base of transistor Q3 by means of conductor 15. An emitter degeneration resistor R4 is coupled between the emitter of current mirror input transistor Q9 and $V_{CC}$ and another emitter degeneration resistor R5 is coupled between the emitter of current mirror input transistor Q10 and $V_{CC}$.

To summarize, the above described embodiments of the invention in effect clamp the output voltage Vout on the collector of main output transistor Q3 at the edge of deep saturation (i.e., in slight saturation) by clamping its collector voltage relative to its base voltage. This is accomplished by using negative feedback through clamping transistor Q6 in its reverse active mode in response to the deep saturation of auxiliary output transistor Q7. Auxiliary output transistor Q7, while in deep saturation, pulls the output voltage Vout substantially closer to the emitter voltage of main output transistor Q3 and hence substantially closer to the lower supply voltage $V_{SS}$. By avoiding deep saturation of the main output transistor Q3, the output stage 4-1 can respond much faster and thereby allows fast switching of the comparator output voltage Vout. The above described embodiments of the invention may be advantageously used instead of multiple emitter follower current gain stages in low voltage circuits in which use of multiple emitter follower current gain stages is usually problematic. The above described embodiments of the invention also reduce the quiescent current requirement of the comparator (or amplifier) for a predetermined output load current specification.

The invention also improves the performance of fast switching power amplifier output stages. Furthermore, the present invention also overcomes some limitations of the previously mentioned Baker clamp circuit, and allows the bipolar transistor output stage to drive large loads without giving up too much operating voltage range (due to the use of too many emitter followers), and prevents output voltage from going into extreme saturation but nevertheless allows it to swing very close to the lower supply voltage $V_{SS}$.

Output stage 1-4 of FIG. 4 includes a positive feedback loop through transistor Q8 and current mirror 17A, in contrast to the output stage 1-3 of FIG. 3. This can be understood by assuming the output transistor Q3 needs to drive a 10 milliampere load and therefore needs a large base current, which must be supplied by current mirror output transistor Q10. Current mirror output transistor Q10 mirrors the current drawn through current mirror input transistor Q9 by transistor Q8. The current mirrored by transistor Q10 is injected into conductor 15, and hence into the bases of both main output transistor Q3 and transistor Q8, thereby providing positive feedback. This can cause circuit instability (oscillation) and various other problems such as lock-up. However, providing suitable values of emitter degeneration resistors R4 and R5 can substantially ameliorate these problems by reducing the current gain of current mirror transistors Q4 and Q5 and reducing the amount of positive feedback.

While the invention has been described with reference to several particular embodiments thereof, those skilled in the art will be able to make various modifications to the described embodiments of the invention without departing from its true spirit and scope. It is intended all elements or steps which are insubstantially different from those recited in the claims but perform substantially the same functions, respectively, in substantially the same way to achieve the same result as what is claimed are within the scope of the invention. For example, it may be practical to replace transistors Q1 and Q2 with substantially different gain circuitry and to also replace transistors Q4 and Q5 with substantially different gain circuitry and nevertheless achieve the benefits of the described embodiments in FIGS. 2 and 3. As another example, in auxiliary output stage 3 of the circuit shown in FIG. 2, it may in some cases be possible to connect conductor 11 directly to the base of auxiliary output transistor Q7 and omit transistors Q4 and Q5 and their associated current sources 13 and 14. Similarly, in some cases it may also be possible to connect conductor 11 directly to the base of main output transistor Q3 and omit transistors Q1 and Q2.

What is claimed is:

1. A circuit comprising:
   (a) a main output stage including a main output transistor having a base coupled to operate in response to a first input signal, an emitter coupled to a first reference voltage, and a collector coupled to an output conductor;
   (b) an auxiliary output stage including an auxiliary output transistor having a base coupled to operate in response to the first input signal, an emitter coupled to the first reference voltage, and a collector coupled to the output conductor;

(c) a clamping transistor having a control electrode coupled to the base of the auxiliary output transistor, a first electrode coupled to provide feedback via a first gain circuit to the base of the main output transistor and to also provide feedback to the base of the auxiliary output transistor, and a second electrode coupled to the collector of the auxiliary output transistor; and (d) wherein the auxiliary output stage supplies an amount of drive to the base of the auxiliary output transistor corresponding to an amount of drive supplied by the main output stage to the base of the main output transistor such that the auxiliary output transistor goes into deep saturation and causes the clamping transistor to generate negative feedback that limits drive to the base of the main output transistor so as to prevent the main output transistor from going into deep saturation, a current boost circuit, an additional output transistor having a base coupled to the base of the auxiliary output transistor, an emitter coupled to the first reference voltage, and a collector coupled to an input of the current boost circuit, an output of the current boost circuit being coupled to the base of the main output transistor.

2. The circuit of claim 1, wherein an emitter area of the auxiliary output transistor is substantially smaller than an emitter area of the main output transistor, wherein the emitter of the main output transistor is coupled by a first resistor to the first reference voltage, and wherein the emitter of the auxiliary output transistor is coupled by a second resistor to the first reference voltage, and wherein the first electrode of the clamping transistor is also coupled to provide the feedback via a second gain circuit to the base of the auxiliary output transistor.

3. The circuit of claim 2 wherein the auxiliary output stage supplies an amount of drive to the base of the auxiliary output transistor that is approximately equal to the amount of drive supplied by the main output stage to the base of the main output transistor.

4. The circuit of claim 2 wherein the first gain circuit includes a first transistor having a control electrode coupled to receive the first input signal, a first electrode coupled to a control electrode of a second transistor, and a second electrode coupled to a first reference voltage, and wherein the main output transistor has a base coupled to a first electrode of the second transistor.

5. The circuit of claim 4 wherein the second gain circuit includes a third transistor having a control electrode coupled to receive the first input signal, a first electrode coupled to a control electrode of a fourth transistor, and a second electrode coupled to the first reference voltage, and wherein the auxiliary output transistor has a base coupled to a first electrode of the fourth transistor and an emitter coupled by a second resistor to the first reference voltage.

6. The circuit of claim 5 wherein the first transistor is a PNP transistor and the second transistor is an NPN transistor, an emitter of the first transistor being coupled to a first current source and a base of the second transistor, an emitter of the second transistor being coupled to a second current source and the base of the main output transistor, and wherein the third transistor is a PNP transistor and the fourth transistor is an NPN transistor, an emitter of the third transistor being coupled to a third current source and a base of the fourth transistor, an emitter of the fourth transistor being coupled to a fourth current source and the base of the auxiliary output transistor.

7. The circuit of claim 6 wherein the clamping transistor is an NPN transistor having an emitter coupled to the bases of the first and third transistors, a base coupled to the base of the auxiliary output transistor, and a collector coupled to the collector of the auxiliary output transistor.

8. The circuit of claim 6 including an input circuit that produces the first input signal in response to a second input signal and a third input signal, wherein the circuit is a comparator.

9. The circuit of claim 1 wherein the current boost circuit includes a diode-connected current mirror input transistor coupled to the collector of the additional output transistor and a current mirror output transistor coupled to the base of the main output transistor.

10. The circuit of claim 9 wherein the additional output transistor is an NPN transistor and the current mirror input transistor and the current mirror output transistor are PNP transistors.

11. The circuit of claim 6 including a current boost circuit, an additional output transistor having a base coupled to the base of the auxiliary output transistor, an emitter coupled by a third resistor to the first reference voltage, and a collector coupled to an input of the current boost circuit, an output of the current boost circuit being coupled to the base of the main output transistor, wherein the current boost circuit includes a diode-connected current mirror input transistor coupled to the collector of the additional output transistor and a current mirror output transistor coupled to the base of the main output transistor, wherein the current mirror output transistor is scaled relative to the current mirror input transistor so as to provide adequate boost current into the base of the main output transistor for a predetermined amount of current produced by the third current source.

12. The circuit of claim 2 wherein the main output transistor is composed of a plurality of parallel-connected unit transistors and the auxiliary output transistor has the same emitter area as a single unit transistor.

13. The circuit of claim 12 wherein the first resistor is composed of a plurality of unit resistors each having a first terminal coupled to an emitter of a corresponding one of the unit transistors and a second terminal coupled to the first reference voltage.

14. The circuit of claim 2 wherein the emitter area of the auxiliary output transistor is sufficiently smaller than the emitter area of the main output transistor to cause auxiliary output transistor to go into deep saturation in response to the first and second input signals before the main output transistor can go into deep saturation.

15. A method for preventing deep saturation of an output transistor in an output stage that is driving an output voltage to a level very close to its emitter voltage, the method comprising:

(a) applying a first voltage level of a drive signal to an input of a main output stage including gain circuitry for driving a base of a main output transistor having an emitter coupled to the first reference voltage and a collector coupled to an output conductor conducting the output voltage;

(b) also applying the first voltage level of the drive signal to an input of an auxiliary output stage for driving a base of an auxiliary output transistor having an emitter coupled to the first reference voltage and a collector coupled to the output conductor; and (c) turning on a clamping transistor when the auxiliary output transistor goes into a deep saturation condition to cause the clamping transistor to provide negative feedback from the collector of the auxiliary output transistor to the main output stage to prevent the main output transistor from going into a deep saturation condition, operating the auxiliary output stage to supply an amount of drive to the base of the auxiliary output transistor that is approximately equal to an amount of drive supplied by the main output stage to the base of the main output transistor, and operating an additional output transistor having a base coupled to the base of the auxiliary output transistor and a collector coupled to an input of a current mirror to cause the current mirror to supply a boost current to the base of the main output transistor.

16. The method of claim 15 including coupling a constant current source to supply a limited amount of base current to the auxiliary output transistor to effectively limit the amount of the boost current and thereby limit positive feedback between the base of auxiliary output transistor and the base of the main output transistor.

17. The method of claim 15 including providing the auxiliary output transistor with an emitter area that is sufficiently smaller than the emitter area of the main output transistor to cause the auxiliary output transistor to go into deep saturation in response to the first and second input signals before the main output transistor can go into deep saturation.

18. The method of claim 15 including operating an additional output transistor having a base coupled to the base of the auxiliary output transistor to produce a feedback current representative of current in the collector of the auxiliary output transistor, and mirroring the feedback current into the base of the main output transistor by means of a current mirror.

19. A circuit for preventing deep saturation of an output transistor in an output stage that is driving an output voltage to a level very close to its emitter voltage, the method comprising:
(a) means for applying a first voltage level of a drive signal to an input of a main output stage including circuitry for driving a base of a main output transistor having an emitter coupled by a first resistor to the first reference voltage and a collector coupled to an output conductor conducting the output voltage;
(b) means for also applying the first voltage level of the drive signal to an input of an auxiliary output stage including circuitry for driving a base of an auxiliary output transistor having an emitter coupled by a second resistor to the first reference voltage and a collector coupled to the output conductor;
(c) means for turning on a clamping transistor when the auxiliary output transistor goes into a deep saturation condition to cause the clamping transistor to provide negative feedback from the collector of the auxiliary output transistor to the input of the main output stage to prevent the main output transistor from going into a deep saturation condition,
wherein the auxiliary output stage supplies an amount of drive to the base of the auxiliary output transistor corresponding to an amount of drive supplied by the main output stage to the base of the main output transistor such that the auxiliary output transistor goes into deep saturation and causes the clamping transistor to generate negative feedback that limits drive to the base of the main output transistor so as to prevent the main output transistor from going into deep saturation,
a current boost circuit,
an additional output transistor having a base coupled to the base of the auxiliary output transistor,
an emitter coupled to the first reference voltage,
and a collector coupled to an input of the current boost circuit, an output of the current boost circuit being coupled to the base of the main output transistor.

20. A circuit comprising:
(a) an output stage including gain circuitry having an input coupled to receive an input signal, a main output transistor having a base coupled to an output of the gain circuitry, an emitter coupled by a first resistor to a first reference voltage, and a collector coupled to an output conductor;
(b) a clamping transistor having a control electrode coupled to the base of an auxiliary output transistor, a first electrode coupled to the input of the gain circuitry, and a second electrode coupled to the collector of the auxiliary output transistor; and
(c) boost circuitry including
(1) an additional output transistor having a base coupled to the base of the auxiliary output transistor, an emitter coupled by a second resistor to the first reference voltage to produce a collector current representative of current in the collector of the auxiliary output transistor, and
(2) a current mirror for mirroring the collector current of the auxiliary output transistor via the gain circuitry into the base of the main output transistor,
wherein the current mirror includes a diode-connected current mirror input transistor coupled to the collector of the additional output transistor and a current mirror output transistor coupled to the base of the main output transistor, a first degeneration resistor coupled between a second reference voltage and an electrode of the current mirror input transistor, and a second degeneration resistor coupled between the second reference voltage and an electrode of the current mirror output transistor.

21. A circuit comprising:
a voltage comparator input stage having a binary output;
(a) a main output stage including a main output transistor having a base coupled to operate in response to a first input signal from an output of the voltage comparator input stage, an emitter coupled to a first reference voltage, and a collector coupled to an output conductor;
(b) an auxiliary output stage including an auxiliary output transistor having a base coupled to operate in response to the first input signal, an emitter coupled to the first reference voltage, and a collector coupled to the output conductor;
(c) a clamping transistor having a control electrode coupled to the base of the auxiliary output transistor and the output of the voltage comparator input stage, a first electrode coupled to provide feedback via a first gain circuit to the base of the main output transistor and to also provide feedback to the base of the auxiliary output transistor, and a second electrode coupled to the collector of the auxiliary output transistor; and
(d) wherein the auxiliary output stage supplies an amount of drive to the base of the auxiliary output transistor corresponding to an amount of drive supplied by the main output stage to the base of the main output transistor such that the auxiliary output transistor goes into deep saturation and causes the clamping transistor to generate negative feedback that limits drive to the base of the main output transistor so as to prevent the main output transistor from going into deep saturation,
the circuit further including a current boost circuit, an additional output transistor having a base coupled to the base of the auxiliary output transistor, an emitter coupled to the first reference voltage, and a collector coupled to an input of the current boost circuit, an output of the current boost circuit being coupled to the base of the main output transistor.

22. The circuit of claim 20, wherein an emitter area of the auxiliary output transistor is substantially smaller than an emitter area of the main output transistor, wherein the emitter of the main output transistor is coupled by a first resistor to the first reference voltage, and wherein the emitter of the auxiliary output transistor is coupled by a second resistor to the first reference voltage, and wherein the first electrode of the clamping transistor is also coupled to provide the feedback via a second gain circuit to the base of the auxiliary output transistor.

23. The circuit of claim 22 wherein the auxiliary output stage supplies an amount of drive to the base of the auxiliary output transistor that is approximately equal to the amount of drive supplied by the main output stage to the base of the main output transistor.

24. The circuit of claim 22 wherein the first gain circuit includes a first transistor having a control electrode coupled to receive the first input signal, a first electrode coupled to a control electrode of a second transistor, and a second electrode coupled to a first reference voltage, and wherein the main output transistor has a base coupled to a first electrode of the second transistor.

25. The circuit of claim 24 wherein the second gain circuit includes a third transistor having a control electrode coupled to receive the first input signal, a first electrode coupled to a control electrode of a fourth transistor, and a second electrode coupled to the first reference voltage, and wherein the auxiliary output transistor has a base coupled to a first electrode of the fourth transistor and an emitter coupled by a second resistor to the first reference voltage.

26. The circuit of claim 25 wherein the first transistor is a PNP transistor and the second transistor is an NPN transistor, an emitter of the first transistor being coupled to a first current source and a base of the second transistor, an emitter of the second transistor being coupled to a second current source and the base of the main output transistor, and wherein the third transistor is a PNP transistor and the fourth transistor is an NPN transistor, an emitter of the third transistor being coupled to a third current source and a base of the fourth transistor, an emitter of the fourth transistor being coupled to a fourth current source and the base of the auxiliary output transistor.

27. The circuit of claim 26 wherein the clamping transistor is an NPN transistor having an emitter coupled to the bases of the first and third transistors, a base coupled to the base of the auxiliary output transistor, and a collector coupled to the collector of the auxiliary output transistor.

28. The circuit of claim 26 including an input circuit that produces the first input signal in response to a second input signal and a third input signal, wherein the circuit is a comparator.

29. The circuit of claim 21 wherein the current boost circuit includes a diode-connected current mirror input transistor coupled to the collector of the additional output transistor and a current mirror output transistor coupled to the base of the main output transistor.

30. The circuit of claim 29 wherein the additional output transistor is an NPN transistor and the current mirror input transistor and the current mirror output transistor are PNP transistors.

31. The circuit of claim 26 including a current boost circuit, an additional output transistor having a base coupled to the base of the auxiliary output transistor, an emitter coupled by a third resistor to the first reference voltage, and a collector coupled to an input of the current boost circuit, an output of the current boost circuit being coupled to the base of the main output transistor, wherein the current boost circuit includes a diode-connected current mirror input transistor coupled to the collector of the additional output transistor and a current mirror output transistor coupled to the base of the main output transistor, wherein the current mirror output transistor is scaled relative to the current mirror input transistor so as to provide adequate boost current into the base of the main output transistor for a predetermined amount of current produced by the third current source.

* * * * *